US010001000B2

(12) United States Patent
Kulkarni et al.

(10) Patent No.: US 10,001,000 B2
(45) Date of Patent: Jun. 19, 2018

(54) SIMULATING WELL SYSTEM FLUID FLOW BASED ON A PRESSURE DROP BOUNDARY CONDITION

(71) Applicant: Halliburton Energy Services, Inc., Houston, TX (US)

(72) Inventors: Pandurang Manohar Kulkarni, Houston, TX (US); Srinath Madasu, Houston, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1043 days.

(21) Appl. No.: 13/947,264

(22) Filed: Jul. 22, 2013

(65) Prior Publication Data

US 2015/0025858 A1 Jan. 22, 2015

(51) Int. Cl.
*E21B 43/26* (2006.01)

(52) U.S. Cl.
CPC .................... *E21B 43/26* (2013.01)

(58) Field of Classification Search
CPC .............. G01V 1/00; E21B 1/00; E21B 43/26
See application file for complete search history.

(56) References Cited

U.S. PATENT DOCUMENTS

| | | | | |
|---|---|---|---|---|
| 3,886,790 A * | 6/1975 | Plett | .................... | G01L 5/133 73/112.04 |
| 6,605,053 B1 * | 8/2003 | Kamm | .................... | G16H 50/50 604/8 |
| 7,164,990 B2 * | 1/2007 | Bratvedt | .................... | G01P 5/001 702/10 |
| 8,412,500 B2 * | 4/2013 | Weng | .................... | E21B 43/26 703/10 |
| 8,731,889 B2 * | 5/2014 | Du | .................... | E21B 43/267 703/10 |
| 9,228,425 B2 * | 1/2016 | Ganguly | .................... | E21B 43/26 |
| 2005/0032029 A1 * | 2/2005 | Trunk | .................... | G09B 23/06 434/300 |
| 2007/0088487 A1 * | 4/2007 | Lahti | .................... | F02D 37/02 701/104 |

(Continued)

OTHER PUBLICATIONS

Fluent Inc., Fluent 6.3 Users Guide, Sep. 2006, Fluent Inc., 6.3, 836-840 (12-14 to 12-18) & 1865-1871 (25-67 to 25-73).*

(Continued)

*Primary Examiner* — Omar F Fernandez Rivas
*Assistant Examiner* — Justin C Mikowski
(74) *Attorney, Agent, or Firm* — John W. Wustenberg; Parker Justiss, P.C.

(57) ABSTRACT

In some aspects, techniques and systems for modeling fluid flow are described. Pressure gradient values for respective nodes of a one-dimensional flow model are computed. The nodes represent locations of fluid flow along a flow path, and the pressure gradient values are computed based on an approximation of the flow velocity at a point on the flow path. A pressure drop between two opposite ends of the flow path is calculated based on the pressure gradient values. An improved approximation of the flow velocity for the point on the flow path is calculated based on a difference between the calculated pressure drop and a pressure drop boundary condition.

24 Claims, 6 Drawing Sheets

(56) References Cited

U.S. PATENT DOCUMENTS

| | | | | |
|---|---|---|---|---|
| 2007/0219766 | A1* | 9/2007 | Duggleby | G06F 9/3879 703/9 |
| 2010/0076738 | A1* | 3/2010 | Dean | E21B 43/26 703/7 |
| 2010/0252268 | A1* | 10/2010 | Gu | E21B 43/26 166/308.1 |
| 2012/0158380 | A1* | 6/2012 | Hajibeygi | E21B 43/26 703/2 |
| 2013/0096889 | A1* | 4/2013 | Khvoenkova | G06F 17/10 703/2 |
| 2013/0124178 | A1* | 5/2013 | Bowen | E21B 43/26 703/10 |
| 2013/0218539 | A1* | 8/2013 | Souche | G06F 17/5009 703/2 |
| 2013/0238297 | A1* | 9/2013 | Lepage | G01V 99/00 703/2 |
| 2013/0317791 | A1* | 11/2013 | Danielson | G06F 17/5009 703/2 |
| 2014/0000513 | A1* | 1/2014 | Leonard | B05C 5/027 118/610 |
| 2014/0222392 | A1* | 8/2014 | Johnson | G01V 1/40 703/2 |
| 2014/0222393 | A1* | 8/2014 | Bai | G06F 17/5009 703/2 |
| 2014/0222405 | A1* | 8/2014 | Lecerf | G06G 7/50 703/10 |
| 2014/0278298 | A1* | 9/2014 | Maerten | G01V 99/005 703/2 |
| 2015/0060058 | A1* | 3/2015 | Morris | E21B 43/267 166/250.02 |

OTHER PUBLICATIONS

Roger Peyret, Advanced Turbulent Flow Computations, May 19, 2000, Springer, 12-13.*

"Convection-diffusion equation," Wikipedia, accessed online at https://en.wikipedia.org/wiki/Convection%E2%80%93diffusion_equation, last updated Jun. 15, 2016, 7 pages.*

Akbar Mohebbi, Applied Mathematical Modelling, Oct. 2010, Elsevier, vol. 34, Issue 10, pp. 2071-3084.*

Gu, H., Desroches, J. and Eibel, J. L, "Computer Simulation of Multilayer Hydraulic Fractures," paper SPE 64789, 2000 International Conference of Oil and Gas in China, Beijing, Nov. 7-10.*

Koyama et. al., A numberical study on differences in using Navier-Stokes and Reynolds equations for modeling the fluid flow and particle transport in single rock fractures with shear, International Journal of Rock Mechanics & Mining Sciences, 45 (2008) 1082-1101.*

Zhaoli Guo et. al., Lattice BGK Model for Incompressible Navier Stokes Equation, Journal of Computational Physis 165, 288-306 (2000).*

David L. Brown et. al., Accurate Projection Methods for Incompressible Navier Stokes Equations, Journal of Computational Physics 168, 464-499 (2001).*

Fluent Inc., Fluent 6.3 Users Guide, Sep. 2006, Fluent Inc., 6.3, 840-853.*

K. J. Bathe et. al., Finite Element Analysis of Incompressible and Compressible Fluid Flows with Free Surfaces and Structural Interactions, Compufers & Sfructures vol. 56, No. 213, pp. 193-213, 1995 (Year: 1995).*

Kresse, O., et al., "Numerical Modeling of Hydraulic Fracturing in Naturally Fractured Formations," ARMA 11-363, $45^{th}$ US Rock Mechanics/Geomechanics Symposium, San Francisco, California, Jun. 26-29, 2011, 11 pages.

Kamath, J., et al., "Modeling Fluid Flow in Complex Naturally Fractured Reservoirs," SPE 39547, SPE India Oil and Gas Conference and Exhibition, New Delhi, India, Apr. 7-9, 1998, 5 pages.

Weng, X, et al., "Modeling of Hydraulic-Fracture-Network Propagation in a Naturally Fractured Formation," SPE 140253, Nov. 2011 SPE Production & Operations, pp. 368-380, 13 pages.

MFrac—3D Hydraulic Fracturing Simulator, Baker Hughes, copyright 1983-2013, accessed online Jul. 10, 2013 at www.mfrac.com/mfrac.html, 2 pages.

"Meyer Fracturing Simulators," Meyer & Associates, Inc. User's Guide, Ninth Edition, copyright 2011, 1022 pages.

Mangrove Reservoir-Centric Stimulation Design Software, Schlumberger, copyright 2013, accessed online Jul. 10, 2013 at http://www.slb.com/services/completions/stimulation/execution/mangrove.aspx, 1 page.

Mangrove Reservoir-Centric Stimulation Design Software, Schlumberger, copyright 2013, accessed online Jul. 10, 2013 at http:// www.slb.com/~/media/Files/stimulation/product_sheets/design/mangrove_ps.pdf, 2 pages.

Itasca: Software: UDEC: Overview, copyright 2013, accessed online Jul. 10, 2013 at http://www.itascacg.com/udec/overview.php, 1 page.

"Crank-Nicolson method," Wikipedia, accessed online at http://en.wikipedia.org/wiki/Crank-Nicolson_method, last updated May 29, 2013, 5 pages.

"Finite difference method," Wikipedia, accessed online at http://en.wikipedia.org/wiki/Finite_difference_method, last updated Feb. 25, 2013, 6 pages.

"Newton's method," Wikipedia, accessed online at http://en.wikipedia.org/wiki/Newton's_method, last updated Jul. 11, 2013, 17 pages.

"Boundary value problem," Wikipedia, accessed online at http://en.wikipedia.org/wiki/Boundary_value_problem, last updated Mar. 13, 2013, 4 pages.

"Welcome to the family," Knoesis Halliburton Production Enhancement, Oct. 2012, 8 pages.

* cited by examiner

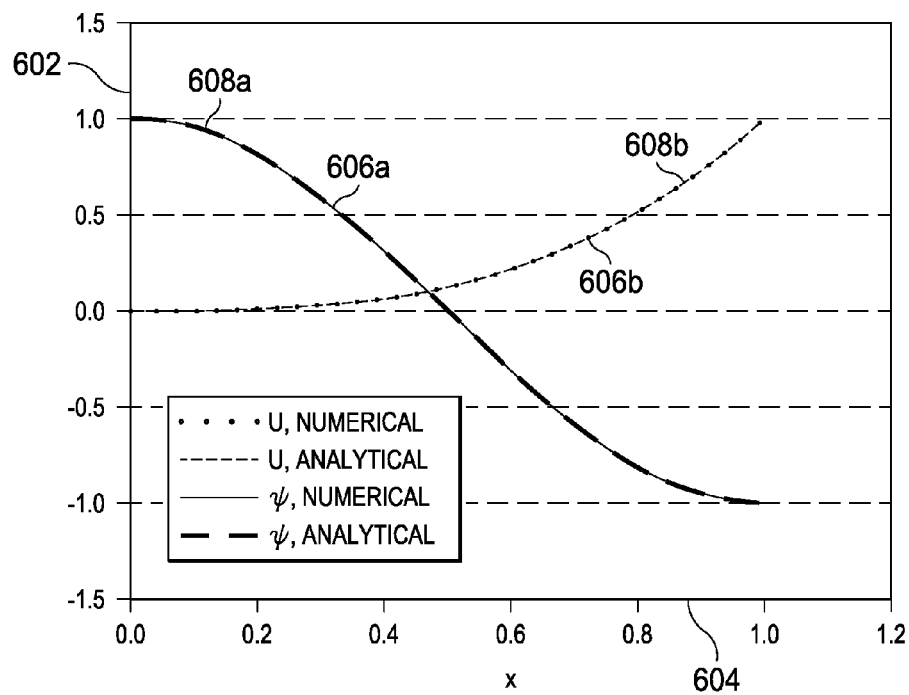
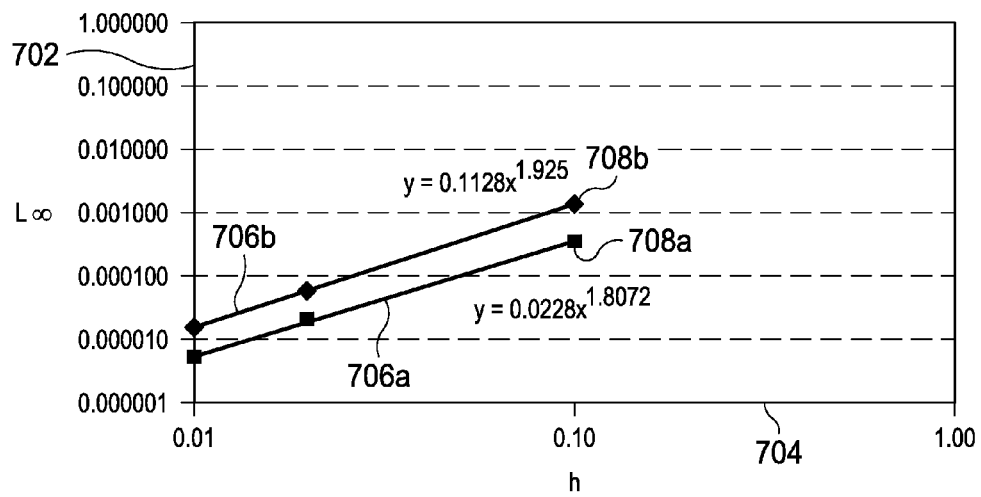

SIMULATING WELL SYSTEM FLUID FLOW BASED ON A PRESSURE DROP BOUNDARY CONDITION

BACKGROUND

The following description relates to simulating the flow of well system fluid based on a pressure drop boundary condition.

Flow models have been used to simulate fluid flow in hydraulic fracture treatments and other environments. During a conventional fracture treatment of a subterranean reservoir, pressurized fluid is communicated from a wellbore into the reservoir at high pressure, and the pressurized fluid propagates fractures within the reservoir rock. Flow models can be used to simulate the flow of fluid, for example, within the fractures. Some conventional software packages model fluid flow in a fracture as a Darcy flow or a slot flow.

DESCRIPTION OF DRAWINGS

FIG. 6 is a plot showing data from an example numerical simulation.

FIG. 7 is a plot showing data from an example numerical simulation.

Like reference symbols in the various drawings indicate like elements.

DETAILED DESCRIPTION

Figure 1:
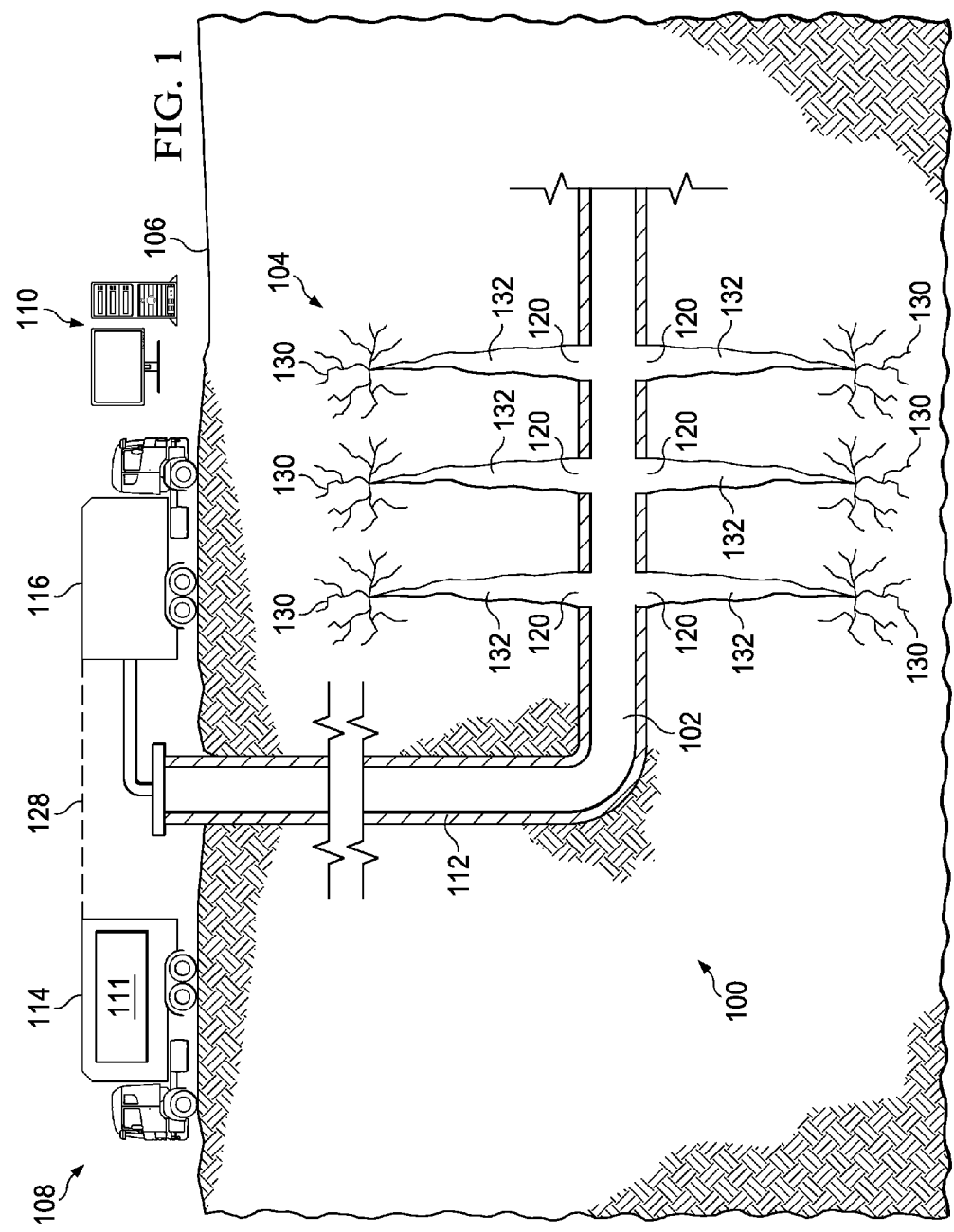
FIG. 1 is a schematic diagram of an example well system.

Fluid flow models can be used to analyze fluid flow, for example, in a well system environment (e.g., in a wellbore, a fracture network, within the reservoir rock matrix, in a well system tool, etc.) or other environments. In some environments, the fluid flow is unsteady and multi-dimensional (e.g., three-dimensional or at least two-dimensional). For example, in some types of fractures, the dominant flow is two-dimensional, and includes transient behaviors. In some instances, two- or three-dimensional flow can be described by a one-dimensional flow model, for example, by integrating the governing flow equations over the cross-section of the two- or three-dimensional flow path. In some cases, the resulting equations can be highly nonlinear partial differential equations that can be solved using finite difference, finite volume, or finite element methods. In some cases, the use of one-dimensional flow models can reduce computational costs, and allow for faster or more computationally efficient simulations. In some instances, a flow model can be used to perform numerical simulations in real time, for example, during a fracture treatment or during another well system activity.

In some implementations, a flow model is used to simulate fluid flow based on limited information about the physical fluid system. For example, some flow models include governing equations (e.g., Equations 1 and 2 below, etc.) that describe flow in terms of flow velocity, and solutions to the governing equations can be found based on an appropriate combination of initial conditions and boundary conditions for the flow velocity. For fluid systems where a full set of boundary conditions for the flow velocity are not available, other types of boundary conditions can be used. For example, fluid pressures in an injection treatment system can often be measured or calculated based on measurements from the injection treatment system, while measurements of fluid velocity are not as readily available in some scenarios. For these and other types of scenarios, the pressure data can be used as a boundary condition, for example, even if some or all of the governing equations are not necessarily cast in terms of pressure variables (e.g., Equation 1 below does not include a pressure or pressure gradient term). For example, some flow models can be solved based on a pressure drop boundary condition. In some contexts, such flow models can provide fast convergence, accurate results, and greater robustness and flexibility.

Some implementations of the subject matter described here can provide advantages or benefits. For example, in some instances, a fluid flow model can provide an efficient, accurate prediction of the fluid pressure and fluid velocity distribution inside a fracture or another type of flow passage. Flow models can be implemented using codes and algorithms that are fast and robust, and compatible with diverse program interfaces. Incompressible fluid flow in a fracture can be simulated using the finite difference framework while accounting for inlet velocity and pressure drop boundary conditions. The simulations can use other numerical discretization techniques, such as, for example, finite difference, finite volume or finite element techniques. In some cases, Newton's method can provide fast convergence in obtaining a solution, for example, that satisfies the pressure drop boundary condition. The implicit Crank-Nicolson technique can be used for time marching, and the central differencing technique can be used for spatial derivatives. These and other numerical techniques can provide a solution that is accurate to second order (or higher) in space and time, that is unconditionally stable irrespective of material properties (e.g., Reynolds number) of the fluid, that is unconditionally stable irrespective of the numerical discretization (e.g., time step and number of grid points), or a combination of these.

In some cases, a fluid flow model models the flow of fluid in a fracture, for example, during a hydraulic fracturing treatment or another type of injection treatment. Hydraulic fracturing can improve the conductivity of a hydrocarbon reservoir, and modeling the hydraulic fracturing treatment can help to efficiently design, analyze, or optimize the treatment. In some cases, a hydraulic fracturing model combines simulations of fracture propagation, rock deformation, fluid flow, proppant transport, and other phenomena. The fluid flow models used in these and other types of simulations can account for the complex physical environments and conditions associated with some hydraulic fracturing activities. For example, in cases where the fluid pressure in the fractures and the rock deformation are implicitly coupled, the flow models can interact such that the solution of one model affects the other. As another example, some subterranean formations include low-permeability, naturally-fracture rock media, and the flow models can model a discrete or complex fracture network where the induced fractures interact with natural fractures. Other types of environments and conditions can be modeled.

FIG. 1 is a diagram of an example well system 100 and a computing subsystem 110. The example well system 100 includes a wellbore 102 in a subterranean region 104 beneath the ground surface 106. The example wellbore 102 shown in FIG. 1 includes a horizontal wellbore. However, a well system may include any combination of horizontal, vertical, slant, curved, or other wellbore orientations. The well system 100 can include one or more additional treatment wells, observation wells, or other types of wells.

The computing subsystem 110 can include one or more computing devices or systems located at the wellbore 102 or other locations. The computing subsystem 110 or any of its components can be located apart from the other components shown in FIG. 1. For example, the computing subsystem 110 can be located at a data processing center, a computing facility, or another suitable location. The well system 100 can include additional or different features, and the features of the well system can be arranged as shown in FIG. 1 or in another configuration.

The example subterranean region 104 may include a reservoir that contains hydrocarbon resources, such as oil, natural gas, or others. For example, the subterranean region 104 may include all or part of a rock formation (e.g., shale, coal, sandstone, granite, or others) that contain natural gas. The subterranean region 104 may include naturally fractured rock or natural rock formations that are not fractured to any significant degree. The subterranean region 104 may include tight gas formations that include low permeability rock (e.g., shale, coal, or others).

The example well system 100 shown in FIG. 1 includes an injection system 108. The injection system 108 can be used to perform an injection treatment, whereby fluid is injected into the subterranean region 104 through the wellbore 102. In some instances, the injection treatment fractures part of a rock formation or other materials in the subterranean region 104. In such examples, fracturing the rock may increase the surface area of the formation, which may increase the rate at which the formation conducts fluid resources to the wellbore 102.

The example injection system 108 can inject treatment fluid into the subterranean region 104 from the wellbore 102. For example, a fracture treatment can be applied at a single fluid injection location or at multiple fluid injection locations in a subterranean zone, and the fluid may be injected over a single time period or over multiple different time periods. In some instances, a fracture treatment can use multiple different fluid injection locations in a single wellbore, multiple fluid injection locations in multiple different wellbores, or any suitable combination. Moreover, the fracture treatment can inject fluid through any suitable type of wellbore, such as, for example, vertical wellbores, slant wellbores, horizontal wellbores, curved wellbores, or combinations of these and others.

The example injection system 108 includes instrument trucks 114, pump trucks 116, and an injection treatment control subsystem 111. The example injection system 108 may include other features not shown in the figures. The injection system 108 may apply injection treatments that include, for example, a multi-stage fracturing treatment, a single-stage fracture treatment, a mini-fracture test treatment, a follow-on fracture treatment, a re-fracture treatment, a final fracture treatment, other types of fracture treatments, or a combination of these.

The pump trucks 116 can include mobile vehicles, immobile installations, skids, hoses, tubes, fluid tanks, fluid reservoirs, pumps, valves, mixers, or other types of structures and equipment. The example pump trucks 116 shown in FIG. 1 can supply treatment fluid or other materials for the injection treatment. The example pump trucks 116 can communicate treatment fluids into the wellbore 102 at or near the level of the ground surface 106. The treatment fluids can be communicated through the wellbore 102 from the ground surface 106 level by a conduit installed in the wellbore 102. The conduit 112 may include casing cemented to the wall of the wellbore 102. In some implementations, all or a portion of the wellbore 102 may be left open, without casing. The conduit 112 may include a working string, coiled tubing, sectioned pipe, or other types of conduit.

The instrument trucks 114 can include mobile vehicles, immobile installations, or other suitable structures. The example instrument trucks 114 shown in FIG. 1 include an injection treatment control subsystem 111 that controls or monitors the injection treatment applied by the injection system 108. The communication links 128 may allow the instrument trucks 114 to communicate with the pump trucks 116, or other equipment at the ground surface 106. Additional communication links may allow the instrument trucks 114 to communicate with sensors or data collection apparatus in the well system 100, remote systems, other well systems, equipment installed in the wellbore 102 or other devices and equipment. In some implementations, communication links allow the instrument trucks 114 to communicate with the computing subsystem 110 that can run simulations and provide simulation data. The well system 100 can include multiple uncoupled communication links or a network of coupled communication links. The communication links can include wired or wireless communications systems, or a combination thereof.

The injection system 108 may also include surface and down-hole sensors to measure pressure, rate, temperature or other parameters of treatment or production. For example, the injection system 108 may include pressure meters or other equipment that measure the pressure of fluids in the wellbore 102 at or near the ground surface 106 level or at other locations. The injection system 108 may include pump controls or other types of controls for starting, stopping, increasing, decreasing or otherwise controlling pumping as well as controls for selecting or otherwise controlling fluids pumped during the injection treatment. The injection treatment control subsystem 111 may communicate with such equipment to monitor and control the injection treatment.

The injection system 108 may inject fluid into the formation above, at or below a fracture initiation pressure for the formation; above, at or below a fracture closure pressure for the formation; or at another fluid pressure. Fracture initiation pressure may refer to a minimum fluid injection pressure that can initiate or propagate fractures in the subterranean formation. Fracture closure pressure may refer to a minimum fluid injection pressure that can dilate existing fractures in the subterranean formation. In some instances, the facture closure pressure is related to the minimum principle stress acting on the formation.

The example injection treatment control subsystem 111 shown in FIG. 1 controls operation of the injection system 108. The injection treatment control subsystem 111 may include data processing equipment, communication equipment, or other systems that control injection treatments applied to the subterranean region 104 through the wellbore 102. The injection treatment control subsystem 111 may be communicably linked to the computing subsystem 110 that can calculate, select, or optimize fracture treatment parameters for initialization, propagation, or opening fractures in the subterranean region 104. The injection treatment control subsystem 111 may receive, generate or modify an injection treatment plan (e.g., a pumping schedule) that specifies properties of an injection treatment to be applied to the subterranean region 104.

In the example shown in FIG. 1, an injection treatment has fractured the subterranean region 104. FIG. 1 shows examples of dominant fractures 132 formed by fluid injection through perforations 120 along the wellbore 102. Generally, the fractures can include fractures of any type, number, length, shape, geometry or aperture. Fractures can extend in any direction or orientation, and they may be formed at multiple stages or intervals, at different times or simultaneously. The example dominant fractures 132 shown in FIG. 1 extend through natural fracture networks 130. Generally, fractures may extend through naturally fractured rock, regions of un-fractured rock, or both. The injected fracturing fluid can flow from the dominant fractures 132, into the rock matrix, into the natural fracture networks 130, or in other locations in the subterranean region 104. The injected fracturing fluid can, in some instances, dilate or propagate the natural fractures or other pre-existing fractures in the rock formation.

In some implementations, the computing subsystem 110 can simulate fluid flow in the well system 100. For example, the computing subsystem 110 can include flow models for simulating fluid flow in or between various locations of fluid flow in the well system, such as, for example, the wellbore 102, the perforations 120, the conduit 112 or components thereof, the dominant fractures 132, the natural fracture networks 130, the rock media in the subterranean region 104, or a combination of these and others. The flow models can model the flow of incompressible fluids (e.g., liquids), compressible fluids (e.g., gases), or a combination multiple fluid phases. In some instances, the flow models can model flow in one, two, or three spatial dimensions. The flow models can include nonlinear systems of differential or partial differential equations. The computing subsystem 110 can use the flow models to predict, describe, or otherwise analyze the dynamic behavior of fluid in the well system 100.

The computing subsystem 110 can perform simulations before, during, or after the injection treatment. In some implementations, the injection treatment control subsystem 111 controls the injection treatment based on simulations performed by the computing subsystem 110. For example, a pumping schedule or other aspects of a fracture treatment plan can be generated in advance based on simulations performed by the computing subsystem 110. As another example, the injection treatment control subsystem 111 can modify, update, or generate a fracture treatment plan based on simulations performed by the computing subsystem 110 in real time during the injection system.

In some cases, the simulations are based on data obtained from the well system 100. For example, pressure meters, flow monitors, microseismic equipment, tiltmeters, or other equipment can perform measurements before, during, or after an injection treatment; and the computing subsystem 110 can simulate fluid flow based on the measured data. In some cases, the injection treatment control subsystem 111 can select or modify (e.g., increase or decrease) fluid pressures, fluid densities, fluid compositions, and other control parameters based on data provided by the simulations. In some instances, data provided by the simulations can be displayed in real time during the injection treatment, for example, to an engineer or other operator of the well system 100.

Some of the techniques and operations described herein may be implemented by a one or more computing systems configured to provide the functionality described. In various instances, a computing system may include any of various types of devices, including, but not limited to, personal computer systems, desktop computers, laptops, notebooks, mainframe computer systems, handheld computers, workstations, tablets, application servers, computer clusters, storage devices, or any type of computing or electronic device.

Figure 2:
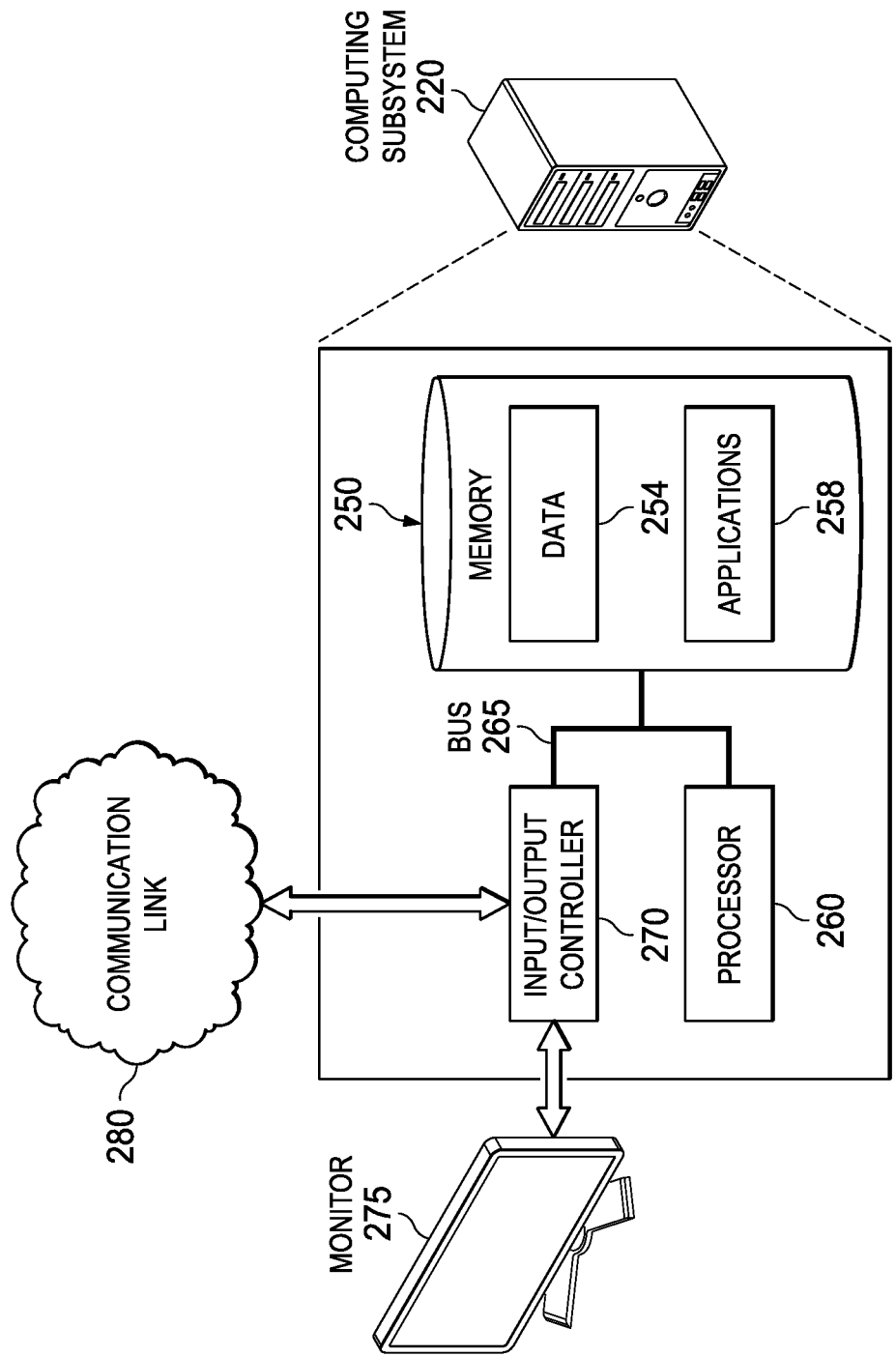
FIG. 2 is a schematic diagram of the example computing system.

FIG. 2 is a diagram of an example computing system 200. The example computing system 200 can operate as the example computing subsystem 110 shown in FIG. 1, or it may operate in another manner. For example, the computing system 200 can be located at or near one or more wells of a well system or at a remote location apart from a well system. All or part of the computing system 200 may operate independent of a well system or well system components. The example computing system 200 includes a memory 250, a processor 260, and input/output controllers 270 communicably coupled by a bus 265. The memory 250 can include, for example, a random access memory (RAM), a storage device (e.g., a writable read-only memory (ROM) or others), a hard disk, or another type of storage medium. The computing system 200 can be preprogrammed or it can be programmed (and reprogrammed) by loading a program from another source (e.g., from a CD-ROM, from another computer device through a data network, or in another manner). In some examples, the input/output controller 270 is coupled to input/output devices (e.g., a monitor 275, a mouse, a keyboard, or other input/output devices) and to a communication link 280. The input/output devices can receive or transmit data in analog or digital form over communication links such as a serial link, a wireless link (e.g., infrared, radio frequency, or others), a parallel link, or another type of link.

The communication link 280 can include any type of communication channel, connector, data communication network, or other link. For example, the communication link 280 can include a wireless or a wired network, a Local Area Network (LAN), a Wide Area Network (WAN), a private network, a public network (such as the Internet), a WiFi network, a network that includes a satellite link, or another type of data communication network.

The memory 250 can store instructions (e.g., computer code) associated with an operating system, computer applications, and other resources. The memory 250 can also store application data and data objects that can be interpreted by one or more applications or virtual machines running on the computing system 200. As shown in FIG. 2, the example memory 250 includes data 254 and applications 258. The data 254 can include treatment data, geological data, fracture data, fluid data, or any other appropriate data. The applications 258 can include flow models, fracture treatment simulation software, reservoir simulation software, or other types of applications. In some implementations, a memory of a computing device includes additional or different data, application, models, or other information.

In some instances, the data 254 include treatment data relating to fracture treatment plans. For example the treatment data can indicate a pumping schedule, parameters of a previous injection treatment, parameters of a future injection treatment, or parameters of a proposed injection treatment. Such parameters may include information on flow rates, flow volumes, slurry concentrations, fluid compositions, injection locations, injection times, or other parameters.

In some instances, the data 254 include geological data relating to geological properties of a subterranean region. For example, the geological data may include information on wellbores, completions, or information on other attributes of the subterranean region. In some cases, the geological data includes information on the lithology, fluid content, stress profile (e.g., stress anisotropy, maximum and minimum horizontal stresses), pressure profile, spatial extent, or other attributes of one or more rock formations in the subterranean zone. The geological data can include information collected from well logs, rock samples, outcroppings, microseismic imaging, or other data sources.

In some instances, the data 254 include fracture data relating to fractures in the subterranean region. The fracture data may identify the locations, sizes, shapes, and other properties of fractures in a model of a subterranean zone. The fracture data can include information on natural fractures, hydraulically-induced fractures, or any other type of discontinuity in the subterranean region. The fracture data can include fracture planes calculated from microseismic data or other information. For each fracture plane, the fracture data can include information (e.g., strike angle, dip angle, etc.) identifying an orientation of the fracture, information identifying a shape (e.g., curvature, aperture, etc.) of the fracture, information identifying boundaries of the fracture, or any other suitable information.

In some instances, the data 254 include fluid data relating to well system fluids. The fluid data may identify types of fluids, fluid properties, thermodynamic conditions, and other information related to well system fluids. The fluid data can include flow models for compressible or incompressible fluid flow. For example, the fluid data can include systems of governing equations (e.g., Navier-Stokes equation, continuity equation, etc.) that represent fluid flow generally or fluid flow under certain types of conditions. In some cases, the governing flow equations define a nonlinear system of equations. The fluid data can include data related to native fluids that naturally reside in a subterranean region, treatment fluids to be injected into the subterranean region, hydraulic fluids that operate well system tools, or other fluids that may or may not be related to a well system.

The applications 258 can include software applications, scripts, programs, functions, executables, or other modules that are interpreted or executed by the processor 260. For example, the applications 258 can include a fluid flow simulation module, a hydraulic fracture simulation module, a reservoir simulation module, or another other type of simulator. The applications 258 may include machine-readable instructions for performing one or more of the operations related to FIGS. 3-5. The applications 258 may include machine-readable instructions for generating a user interface or a plot, for example, illustrating fluid flow or fluid properties. The applications 258 can receive input data, such as treatment data, geological data, fracture data, fluid data, or other types of input data, from the memory 250, from another local source, or from one or more remote sources (e.g., via the communication link 280). The applications 258 can generate output data and store the output data in the memory 250, in another local medium, or in one or more remote devices (e.g., by sending the output data via the communication link 280).

The processor 260 can execute instructions, for example, to generate output data based on data inputs. For example, the processor 260 can run the applications 258 by executing or interpreting the software, scripts, programs, functions, executables, or other modules contained in the applications 258. The processor 260 may perform one or more of the operations related to FIGS. 3-5. The input data received by the processor 260 or the output data generated by the processor 260 can include any of the treatment data, the geological data, the fracture data, or any other data 254.

Figure 3:
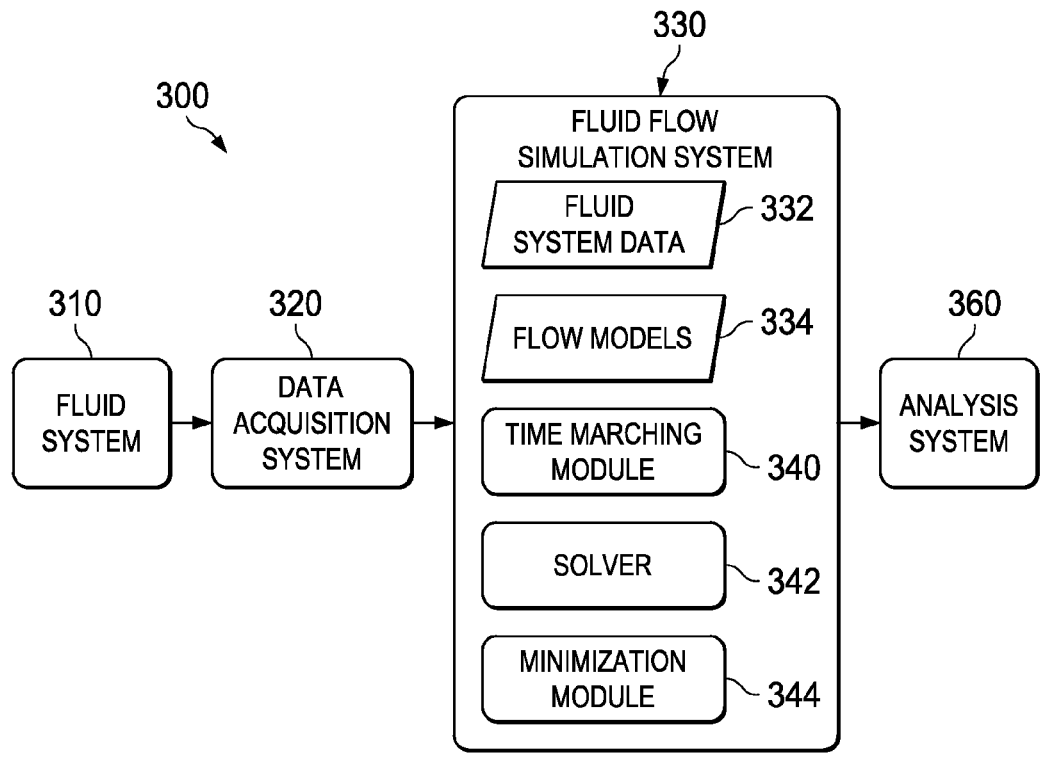
FIG. 3 is a diagram of an example system architecture.

FIG. 3 is a diagram of an example system architecture 300. The example system architecture 300 can be used to model physical phenomena related to a well system. For example, the architecture 300 can be used to model fluid flow in an injection treatment of the subterranean region 104 shown in FIG. 1. In some instances, the architecture 300 is used to model fluid flow and other aspects of an injection treatment or other activities in a well system. In some cases, the architecture 300 is used to model fluid flow through one or more fractures in a complex fracture network, in a dominant bi-wing fracture extending from a wellbore, in a natural fracture network, in hydraulically-induced fractures, or a combination.

The example architecture 300 shown in FIG. 3 includes a fluid system 310, a data acquisition system 320, a fluid flow simulation system 330, and an analysis system 360. The architecture 300 can include additional or different components or subsystems, and the example components shown in FIG. 3 can be combined, integrated, divided, or configured in another manner. For example, the fluid flow simulation system 330 and the analysis system 360 can be subcomponents of an integrated computing system (e.g., the computing system 200 shown in FIG. 2) or multiple computing systems; or the data acquisition system 320 can be integrated with the fluid system 310. As another example, the fluid flow simulation system 330 or the analysis system 360, or both, can be implemented in a computing system that operates independent of the fluid system 310 or the data acquisition system 320.

The example fluid system 310 can include any physical system where fluid flow or other fluid phenomena occur. The fluid system 310 can represent a well system (e.g., the well system 100 shown in FIG. 1) or a subset of well system components or subsystems (e.g., the injection system 108 shown in FIG. 1). The fluid system 310 can represent the physical reservoir rock in a subterranean reservoir (e.g., the subterranean region 104 shown in FIG. 1), fractures or a fracture network in the reservoir rock, one or more downhole systems installed in a wellbore, or a combination of them.

The data acquisition system 320 can include any systems or hardware that obtains fluid data from the fluid system 310. For example, the data acquisition system 320 can include flow sensors, pressure sensors, temperature sensors, and other types of measurement devices. The data acquisition system 320 can include communication and data storage systems that store, transfer, manipulate, or otherwise manage the information obtained from the fluid system. In some examples, the data acquisition system 320 obtains fluid pressure data for one or more points on a flow path.

The fluid flow simulation system 330 can be one or more computer systems or computer-implemented programs that simulate fluid flow. The fluid flow simulation system 330 can receive information related to the fluid system 310 and simulate fluid flow and other fluid phenomena that occur in the fluid system 310. For example, the fluid flow simulation system 330 can calculate flow velocities or other aspects of fluid flow based on pressure data or other information obtained by the data acquisition system 320.

The example fluid flow simulation system 330 includes fluid system data 332, flow models 334, a time marching module 340, a solver 342, and a minimization module 344. The fluid flow simulation system can include additional or different features, and the features of a fluid flow simulation system 330 can be configured to operate in another manner. The modules of the fluid flow simulation system 330 can include hardware modules, software modules, or other types of modules. In some cases, the modules can be integrated with each other or with other system components. In some example implementations, the fluid flow simulation system 330 can be implemented as software running on a computing system, and the modules of the fluid flow simulation system 330 can be implemented as software functions or routines that are executed by the computing system.

The fluid system data 332 can include any information related to the fluid system 310 or another fluid system. For example, the fluid system data 332 can indicate physical properties (e.g., geometry, surface properties, etc.) of one or more flow paths in the fluid system 310, material properties (e.g., density, viscosity, Reynolds number, etc.) of one or more fluids in the fluid system 310, thermodynamic data (e.g., fluid pressures, fluid temperatures, fluid flow rates, etc.) measured at one or more locations in the fluid system 310, and other types of information. The fluid system data 332 can include information received from the data acquisition system 320 and other sources.

The flow models 334 can include any information or modules that can be used to simulate fluid flow. The flow models 334 can include governing equations, spatial and temporal discretization data, or other information. In some examples, the flow models 334 include governing flow equations, such as, for example, the Navier-Stokes equation or related approximations of the Navier-Stokes equation, continuity equations, or other types of flow equations.

The flow models 334 can include spatial discretization data, such as, for example, discrete nodes that represent locations of fluid flow along a flow path in the fluid system 310. The spatial discretization can be implemented by any suitable algorithm. For example, the system can be discretized according to a finite difference model, a finite volume model, finite element model, or another technique. The system can be discretized in a manner that permits spatial derivatives or partial spatial derivatives to be solved in the discretized spatial domain using numerical methods. In some implementations, the conventional central difference method can be used to find solutions in the spatial domain. In certain contexts, the central difference method can provide solutions that are accurate to second (or higher) order. In some instances, the central difference method is stable regardless of the number and spacing of nodes in the discretized spatial domain.

In some implementations, the flow models 334 can include boundary condition data indicating a type of boundary condition to be used in modeling fluid flow. For example, the flow models can include a boundary-condition-computation module that computes a boundary condition based on fluid system data, simulation data, or other types of data. A pressure drop boundary condition or other types of boundary conditions can be computed based on fluid pressure data obtained from the fluid system 310.

The time marching module 340 can include any information or modules that can be used to perform calculations in a discretized time domain. For example, the governing flow equations often include derivatives or partial derivatives in the time domain, and the time marching module 340 can calculate such quantities based on a time marching algorithm. An example time marching algorithm is the Crank-Nicolson method. The Crank-Nicolson method is a conventional time marching algorithm that is analogous to the central-difference technique for handling spatial derivatives. In some implementations, the Crank-Nicolson method can find numerical solutions for partial differential equations, and provide solutions that are accurate to second (or higher) order. In certain contexts, the Crank-Nicolson is stable regardless of the number and size of time steps in the discretized time domain. Other types of time marching algorithms can be used.

The solver 342 can include any information or modules that can be used to solve a system of equations. For example, the solver 342 can be a direct solver or another type of solver. In some implementations, the solver 342 receives inputs from the other components of the fluid flow simulation system 330 and generates a numerical solution for one or more variables of interest based on the inputs. The solution can be generated for each node in a discretized spatial domain. For example, the solver 342 may calculate values of fluid velocity, fluid pressure, or another variable over a spatial domain; the values can be calculated for an individual time step. In some cases, the solver 342 can be expressed as solving a matrix equation $Ak=b$, where k is the variable of interest that is computed by the solver 342, and elements of A and b are provided, for example, based on information from the flow models 334, the fluid system data 332, the minimization module 344, and other sources. In some examples, the variable of interest is the flow velocity u or another flow variable.

The minimization module 344 can include any information or modules that can be used to calculate or iteratively find a minimal value or root of an equation. The minimization module 344 can compare a numerical solution against a boundary condition or other information, and determine whether the numerical solution satisfies the boundary condition or other convergence criteria. When the numerical solution is not accepted, the minimization module 344 can use a minimization algorithm to calculate an improved partial solution or other information, which can be used to generate a full numerical solution that better matches the convergence criteria. An example of a minimization algorithm is Newton's method, which is an iterative technique for finding roots of a minimization function. In some cases, the minimization module 344 obtains an output that is within a predetermined range of a minimum or a root of an equation.

The analysis system 360 can include any systems, components, or modules that analyze, process, use, or access the simulation data generated by the fluid flow simulation system 330. For example, the analysis system 360 can be a real time analysis system that displays or otherwise presents fluid data (e.g., to a field engineer, etc.) during an injection treatment. In some cases, the analysis system 360 includes other simulators or a simulation manager that use the fluid simulation data to simulate other aspects of a well system. For example, the analysis system 360 can be a fracture simulation suite that simulates fracture propagation based on the simulated fluid flow data generated by the fluid flow simulation system 330. As another example, the analysis system 360 can be a reservoir simulation suite that simulates fluid migration in a reservoir based on the simulated fluid flow data generated by the fluid flow simulation system 330.

The example architecture 300 can be used to analyze non-compressible, two-dimensional flow in any type of physical system. In some implementations, the architecture 300 efficiently provides an accurate solution for one-dimensional (1D) incompressible flow equations in a fracture using a pressure drop boundary condition. The architecture 300 can also be used to analyze other types of flow in other environments.

In some examples, the architecture 300 uses a set of governing flow equations that includes the continuity and Navier-Stokes equations in 1D, which can be expressed, respectively, as:

$$u_x = R_1(x,t) \quad (1)$$

$$u_t + uu_x - \mu u_{xx} + \psi = R_2(x,t) \quad (2)$$

where u represents the flow velocity variable, $u_t$ represents a time-derivative of the flow velocity variable u, $u_x$ represents a first-order spatial derivative of the flow velocity variable u, $u_{xx}$ represents a second-order spatial derivative of the flow velocity variable u, $\psi$ represents the pressure gradient variable, $\mu$ represents viscosity of the well bore fluid, $R_1(x,t)$ represents a source term, and $R_2(x,t)$ represents another source term. The pressure gradient $\psi$ can also be represented as $\psi = p_x$, a spatial derivative of a pressure variable p.

The source terms ($R_1(x,t)$, $R_2(x,t)$) can incorporate any other internal or external systems, forces, or phenomena that influence the flow of fluid. For example, in some cases one or more of the source terms can account for the effects of gravity, an inflow or outflow of fluid, or other effects. The source terms can vary over time, space, or both; or they can be constant over time, space, or both.

In this example, the computational domain spans $x \in (0,1)$, where x is the spatial variable representing locations on the flow path. The example governing equations above (i.e., Equations 1 and 2) can be numerically solved, for example, based on initial conditions (e.g., $u(x,t=0)=U_0(x)$ and $\psi(x, t=0)=\Psi_0(x)$) and a boundary condition for the spatial variable x. In some cases, to obtain the numerical solution, the fluid flow simulation system 330 can combine the finite difference framework solved implicitly using the Crank-Nicolson scheme for time-marching and the central difference scheme for spatial derivatives.

The boundary condition for the spatial variable x can include an inlet flow velocity $u_0 = u(x=0,t)$, a pressure drop $G(t) = p(x=1,t) - p(x=0,t)$) between the ends of the fracture, or another type of boundary condition. An iterative technique (e.g., Newton's iteration algorithm, or another type of iterative technique) can be used to solve the governing flow equations for a given time point, for example, in scenarios where the pressure drop boundary condition is available. In some contexts (e.g., in some types of fracture simulation systems and in other systems), the pressures at the ends of the fracture are readily available as a boundary condition, and the inlet boundary condition $u_0$ is not readily available as a boundary condition. The pressure drop boundary condition can be used in other contexts as well.

When the pressure drop boundary condition is used, an iterative numerical technique can include generating an initial estimate for $u_0$ and obtaining a numerical solution for the pressure gradient $\psi(x)$ based on initial estimate for $u_0$. For example, the numerical solution for the pressure gradient $\psi(x)$ can be obtained based on Equation 2 above, or based on another governing flow equation. The pressure gradient can then be used to calculate a pressure difference $Z(u_0)$ between boundaries of the flow path, and the calculated pressure difference $Z(u_0)$ can be compared to the pressure drop boundary condition $G(t)$. The difference between the calculated pressure difference $Z(u_0)$ and the pressure drop boundary condition $G(t)$ can be used to generate an improved estimate for $u_0$.

In some cases, the fluid flow simulation system 330 includes a pressure-drop-computation module that is operable to receive the pressure gradient values, or calculate them based on an approximation of the flow velocity at an end of the flow path. In some cases, the pressure-drop-computation module receives the pressure gradient values from another module of the fluid flow simulation system 300, or from an external source. The pressure-drop-computation module can compute the pressure drop between the opposite ends of the one-dimensional flow path based on the pressure gradient values. The solver 342 module can receive the computed pressure drop and calculate the improved approximation of the flow velocity for the end of the flow path based on a difference between the computed pressure drop and a pressure drop boundary condition.

The initial estimate for $u_0$ at a given time point can be a random guess, a solution from previous time-step, or another type of estimate. On each iteration, an improved estimate of the inlet flow velocity $u_0$ can be obtained, for example, according to a Newton's-method-based algorithm, until the solution meets a convergence criterion. For example, if the calculated pressure difference (based on the numerical solution for the pressure gradient $\psi(x)$) does not match the pressure drop boundary condition $G(t)$, then an improved estimate for $u_0$ can be obtained based on Newton's method. The minimization algorithm can find roots or minima of a minimization function, such as, for example, $f(u_0) = Z(u_0) - G(t)$ or another type of minimization function. If the calculated pressure difference matches the pressure drop boundary condition (e.g., within a threshold amount), the current numerical solution (including the current estimate of $u_0$) can be accepted as having satisfied the convergence criterion.

In some implementations, the improved estimate of the inlet flow velocity $u_0$ can be generated based on information provided by the example minimization module 344. For example, the minimization module can provide parameters of a minimization function $f(u_0)$ for finding an improved estimate of the inlet flow velocity $u_0$. In some instances, given an estimate of the inlet flow velocity ($u_0^i$) for the $i^{th}$ iteration, Newton's method can generate parameters of an improved estimate of the inlet flow velocity ($u_0^{i+1}$) for the $i+1^{th}$ iteration, based on the following iterative expression:

$$u_0^{i+1} = u_0^i + \frac{f(u_0^i)}{f'(u_0^i)}, \quad (3)$$

where $f'(u_0^i)$ represents the derivative of $f(u_0) = Z(u_0) - G(t)$ with respect to the inlet flow velocity $u_0$. The derivative $f'(u_0^i)$ can be obtained, for example, by taking the derivatives of the governing flow equations (e.g., Equations 1 and 2 above) with respect to the inlet flow velocity $u_0$.

As such, in the example outlined above, Equations 1, 2, 3 and possibly other equations can be used to generate inputs for the solver 342. Additional or different information may be used in generating inputs for the solver 342. For example, in some cases, derivatives of one or more of the governing flow equations are used. In the example above, elements of Equation 3 above (e.g., in the denominator) can be obtained based on solving two other equations:

$$\frac{d}{du_0}(u_x = R_1(x,t)) \quad (1')$$

$$\frac{d}{du_0}(u_t + uu_x - \mu u_{xx} + \psi = R_2(x,t)), \quad (2')$$

which are the derivatives of Equations 1 and 2 with respect to the inlet flow velocity $u_0$. As such, Equations 1, 2, 3, 1', and 2' can be used to generate inputs for the solver 342. Based on these equations and other information, the solver 342 can generate flow velocity values u for each node on the discretized flow path model, and the value for the inlet flow velocity $u_0$ generated by the solver can be used as an improved estimate $u_0^{i+1}$ for the next iteration. In some cases, Equations 1 and 2 can be solved independent of Equations 1' and 2'. For example, the two sets of equations can be solved in parallel.

Figure 4:
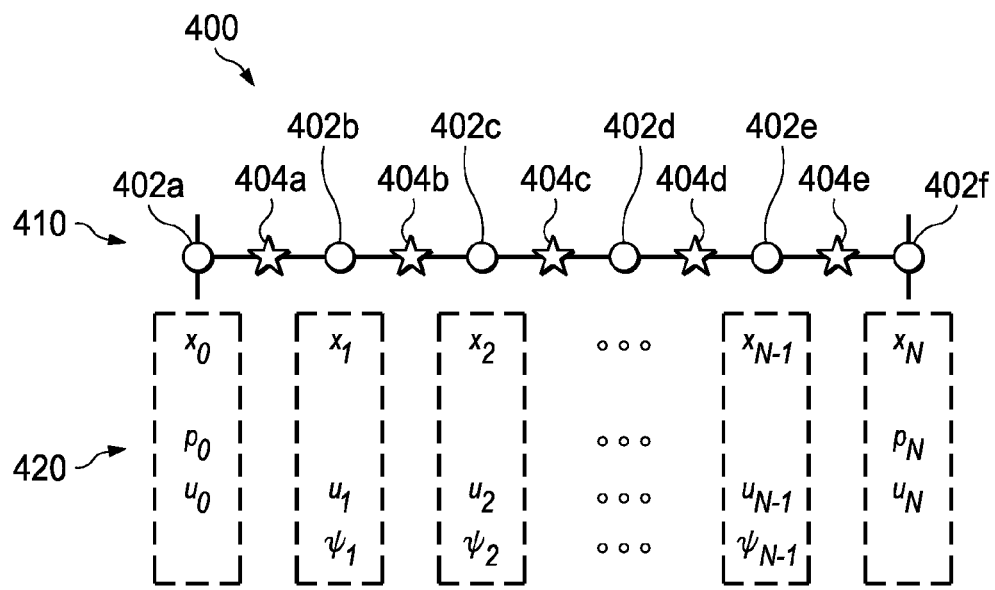
FIG. 4 is a diagram showing aspects of an example fluid flow model.

FIG. 4 is a diagram showing aspects of an example fluid flow model 400. The fluid flow model 400 shown in FIG. 4 is an example of a one-dimensional flow model that includes multiple nodes 402a, 402b, 402c, 402d, 402e, 402f (shown as circles in FIG. 4), where each node represents a respective location of fluid flow along a flow path 410. The nodes in the example flow path 410 shown in FIG. 4 can be a sequence of flow locations that extend through one, two, or three spatial dimensions. As such, the spatial dimension of the one-dimensional flow model does not necessarily correspond to a single physical spatial dimension. In some cases, a one-dimensional flow model can incorporate flow in more than one spatial dimension, for example, to account for intersecting flow paths, etc.

The example flow model 400 shown in FIG. 4 also includes staggered nodes 404a, 404b, 404c, 404d, 404e (shown as stars in FIG. 4) that are used for calculating pressure gradient values across the regular nodes 402a, 402b, 402c, 402d, 402e, 402f. In the example shown, each staggered node resides between two regular nodes. Although six regular nodes and five staggered nodes are shown in FIG. 4, another number of staggered nodes, regular nodes, or both can be used.

In some implementations, the computational domain (e.g., for solving the governing flow equations) includes both the staggered nodes and the regular nodes, and the solution variables (e.g., velocity (u) and pressure gradient ($\psi$)) are defined on the regular nodes. A continuity equation (e.g., Equation 1 above) can be discretized at the staggered nodes 404a, 404b, 404c, 404d, 404e, and a momentum equation (e.g., Equation 2 above) can be discretized at the regular nodes 402a, 402b, 402c, 402d, 402e, 402f. The equations can be discretized, for example, using the central difference technique for both the convection term (e.g., $uu_x$ in Equation 2) and the diffusion term (e.g., $\mu u_{xx}$ in Equation 2). Nonlinearities can be resolved, for example, using a quasi-linearization scheme. The resulting system of linear algebraic equations can be solved iteratively, for example, using a block-pentadiagonal solver or another type of solver.

FIG. 4 shows examples of variables 420 at each of the regular nodes 402a, 402b, 402c, 402d, 402e, 402f of the one-dimensional flow model 400. The spatial variable x has a specified value at each of the respective nodes. As shown in FIG. 4, node 402a represents the location ($x_0$) of one end point of the flow path 410, and node 402f represents the location ($x_N$) of the other end point of the flow path 410. The nodes 402b, 402c, and 402e represent respective locations $x_1$, $x_2$, and $x_{N-1}$ intermediate the two end points. The spacing between the nodes can be uniform or non-uniform. In the example shown in FIG. 4, the spacing between each adjacent pair of nodes is equal. For example, the grid spacing (i.e., the distance between each pair of adjacent nodes) can be represented as $h=x_{i+1}-x_i$.

The variables 420 also include examples of dynamic variables for each of the nodes. As shown in FIG. 4, the variable $u_0$ is associated with the node 402a and represents the flow velocity at the location $x_0$. Similarly, the variables $u_1$, $u_2$, $u_{N-1}$ and $u_N$ represent the flow velocity at the respective locations $x_1$, $x_2$, $x_{N-1}$ and $x_N$ associated with the nodes 402b, 402c, 402e, and 402f; and the variables $\psi_1$, $\psi_2$, and $\psi_{N-1}$ represent pressure gradient values at the respective locations $x_1$, $x_2$, and $x_{N-1}$ associated with nodes 402b, 402c, and 402e. The variables $p_0$ and $p_N$ represent pressure values at respective locations $x_1$ and $x_N$ at the end points of the flow path 410.

In some cases, the values of the pressure variables at the end points provide a boundary condition for finding values of the other variables (e.g., u and $\psi$). For example, the pressure variables can be based on measurements, estimates, simulations, or other information from a physical fluid system that is being simulated, and the pressure difference boundary condition can be used to ensure that the simulation provides an output that is consistent with data obtained from the physical system. In some cases, the pressure at the end points of the flow path can be derived from measurements by pressure sensors in a well system, or from other types of information. Given values for the pressure variables $p_0$ and $p_N$ at a particular time point $t_0$, the pressure drop boundary condition for the particular time point can be expressed $G=p_N-p_0$. A pressure drop boundary condition can be computed based on other information or obtained in another manner.

In some cases, the pressure gradient values $\psi_1$, $\psi_2$, ... $\psi_{N-1}$ are computed by solving a governing flow equation based on an estimated flow velocity for one of the nodes (e.g., an estimated flow velocity for one of the end points $u_0$ or $u_N$, or for one of the intermediate points $u_1 \ldots u_{N-1}$). For example, Equation 2 can be used to numerically solve for each pressure gradient value $\psi_i$ based on an estimated value for the flow velocity $u_0$. In some cases, the pressure gradient values $\psi_i$ are computed based on a difference between pressures at the staggered nodes. For example, the pressure gradient value $\psi_1$ at the regular node 402b can be calculated based on pressure drop between the neighboring staggered nodes 404a and 404b.

The computed pressure gradient values $\psi_i$ can be used to compute a pressure difference between end points of the flow path 410. For example, the pressure drop across the flow path 410 can be computed as $$Z(u_0)=h\Sigma_{i=2}^{N-1}\psi_i, \quad (4)$$

where h is the grid spacing. An iterative minimization algorithm (e.g., Newton's method) can then be used to iteratively solve for a value of $u_0$ that reduces or minimizes a minimization function $$f(u_0)=Z(u_0)-G. \quad (5)$$

Each iteration can calculate an improved value for the flow velocity $u_0$, for example, by generating a solution to the governing flow equations that better approximates the pressure drop boundary condition.

The iterative minimization algorithm can be configured to terminate upon finding a solution that satisfies a convergence criterion or another condition. For example, when the pressure drop generated from a numerical solution matches the pressure drop boundary condition (e.g., within a predefined threshold), that numerical solution can be accepted and the iterative algorithm for that particular time point can be terminated. The numerical solution for that time point can be used as an initial estimate for the next time point.

In some implementations, the overall fluid flow simulation involves at least two high-level iterative loops. For example, an outer iterative loop can be used for nonlinearity convergence, and an inner iterative loop can be used for convergence of the pressure-drop boundary condition. Newton's method or another type of algorithm can be used for the inner iterative loop, within each outer iteration for nonlinear convergence.

Figure 5:
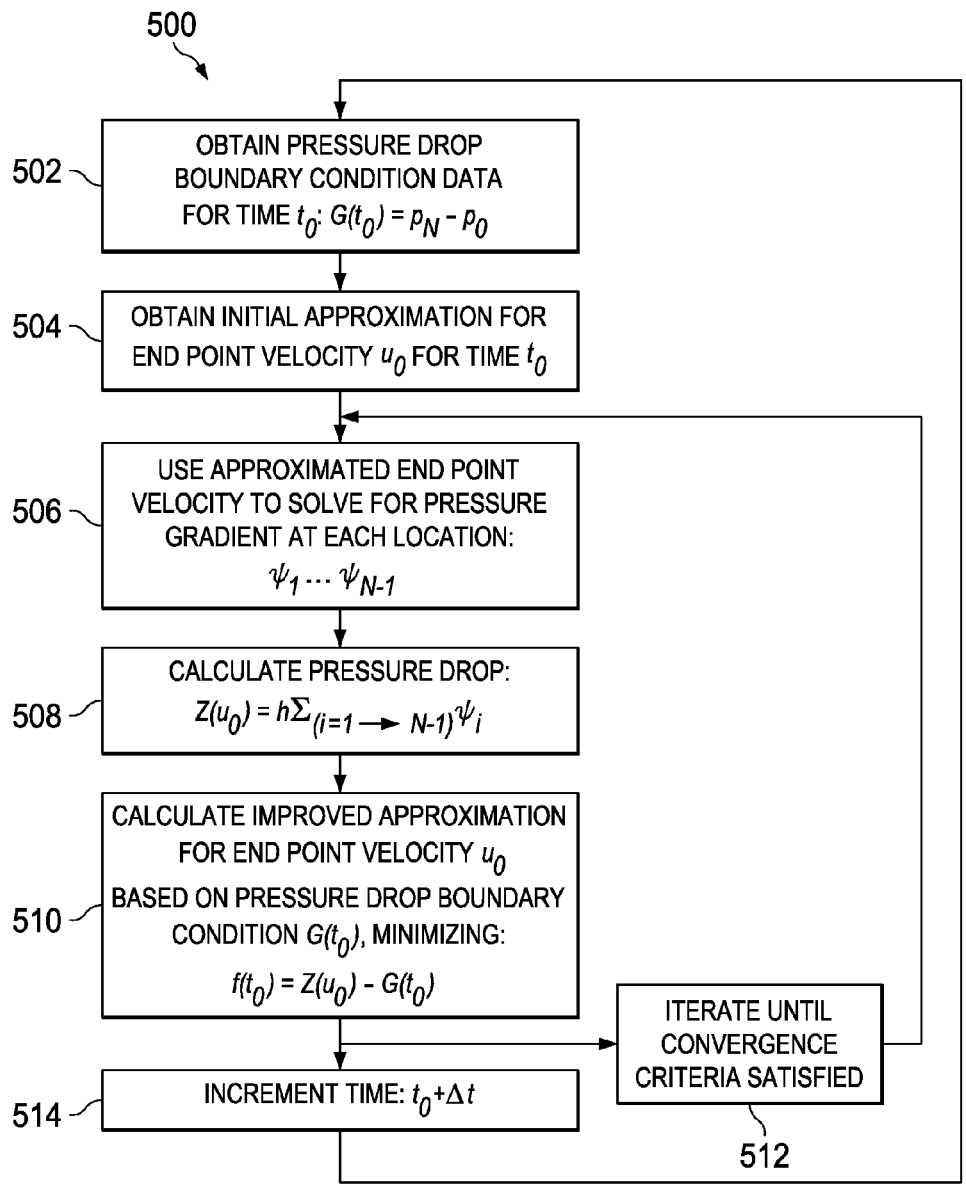
FIG. 5 is a flow chart showing an example technique for modeling fluid flow.

FIG. 5 is a flow chart showing an example process 500 for simulating fluid flow. All or part of the example process 500 may be computer-implemented, for example, using the features and attributes of the example computing system 200 shown in FIG. 2 or other computing systems. The process 500, individual operations of the process 500, or groups of operations may be iterated or performed in parallel, in series, or in another manner. In some cases, the process 500 may include the same, additional, fewer, or different operations performed in the same or a different order.

The example process 500 can be used to simulate incompressible flow in a variety of physical systems. In some implementations, the process 500 is used to simulate flow in a fluid injection or production system (e.g., in a wellbore, in a flow control device or flow conduit installed in a wellbore, etc.), within a subterranean formation (e.g., from a wellbore into reservoir media, through a rock matrix in the reservoir media, through fractures or discontinuities in the reservoir media, etc.), or combinations thereof. The process 500 may also be used to simulate flow in other environments, for example, outside the context of a well system.

The example process 500 can be used to simulate the flow of various fluids. In some cases, the process 500 is used to simulate one or more well system fluids. Here, the term "well system fluid" is used broadly to encompass a wide variety of fluids that may be found in or near, or may be used in connection with, a well system. Well system fluids can include one or more native fluids that reside in a subterranean region (e.g., brine, oil, natural gas, etc.), one or more fluids that have been or will be injected into a subterranean region (e.g., fracturing fluids, treatment fluids, etc.), one or more fluids that have been or will be communicated within a wellbore or within one or more tools installed in the well bore (e.g., drilling fluids, hydraulic fluids, etc.), and other types of fluids.

The example process 500 can simulate fluid flow based on a one-dimensional fluid flow model. The flow model can include nodes of a discretized one-dimensional flow path. In some instances, two of the nodes represent end points of the flow path, and the other nodes represent a series of locations along the flow path between the end points. For example, the process 500 can use the example flow model 400 shown in FIG. 4, or another type of flow model. The flow model can also include governing equations and associated variables for each of the nodes. For example, the flow model can include the variables 420 shown in FIG. 4, and the flow model can include one or more of the example Equations 1, 2, 1', and 2' shown above. The flow model can include other types of variables or equations. In some cases, the flow model includes a system of nonlinear partial differential equations (e.g., Equations 1 and 2, or another nonlinear system).

In some implementations, the one-dimensional flow model is configured to model the flow of well system fluid in a fracture in a subterranean region, where the nodes of the flow model represent a sequence of locations at which fluid can flow through the fracture. The ends of the flow path can correspond to intermediate points within a fracture. One or both of the ends of the flow path can correspond to an open or closed end of the fracture. For example, one or both ends of the fracture can be open to another fracture, a wellbore, a perforation in a wellbore casing, a flow control device in a wellbore, etc. In some cases, one or both ends of the fracture are closed, for example, where the fracture terminates in the subterranean region.

At 502, pressure drop boundary condition data for a time point $t_0$ are obtained. The pressure drop boundary condition data can be obtained, for example, by computing a pressure drop from pressures at the flow path end points, by receiving previously-computed pressure drop boundary condition data from memory, or by another technique. As an example, in some cases, the pressure drop boundary condition can be computed as $G(t_0) = p_N - p_0$, where $p_0$ represents the fluid pressure at one of the flow path end points, and $p_N$ represents the fluid pressure at the other flow path end point.

At 504, an initial approximation for the end point velocity $u_0$ is obtained. Here, $u_0$ represents an approximation of the fluid flow velocity at the location $x_0$ at the end of the flow path, at time $t_0$. The initial approximation can be obtained from a solution for a prior time point, or the initial approximation can be a predetermined value, a random guess, or another approximation. After obtaining the initial approximation for the end point velocity $u_0$, the process 500 performs an iterative procedure that is represented in FIG. 5 by operations 506, 508, 510, and 512. In some implementations, on each iteration, an improved approximation for the end point velocity $u_0$ can be generated.

At 506, the current approximation for the end point velocity $u_0$ is used to obtain a numerical solution for the pressure gradient $\psi_i$, for each location i=1 . . . N-1. Any suitable technique can be used to obtain the numerical solution. For example, a direct solver can be used to solve the governing fluid flow equations.

In the example shown in FIG. 5, the numerical solution for the pressure gradients $\psi_i$ is obtained based on the approximation for the end point velocity $u_0$. In some implementations, the numerical solution for the pressure gradients $\psi_i$ is obtained based on additional or different information, such as, for example, an approximation for the flow velocity at another location. For example, an approximation for the flow velocity at another node in the flow model can be used (instead of, or in addition to, the end point flow velocity). For instance, at 504, an initial approximation for the flow velocity $u_i$ at a location $x_i$ (for any node i) can be obtained; and at 506, the current approximation for flow velocity $u_i$ can be used to obtain the pressure gradient values $\psi_i$. Other operations in the process 500 (e.g., 508, 510, 512) can be modified accordingly, and on each iteration, an improved approximation for the flow velocity $u_i$ can be generated.

At 508, the pressure drop between the end points is calculated based on the numerical solution for the pressure gradient. The pressure drop can be computed, for example, based on the pressure gradient values $\psi_i$ computed at 506 and other information. In some examples, the pressure drop is computed as shown in Equation 4 above, or in another manner. If the pressure drop computed at 508 satisfies a convergence criterion, the minimization loop can be terminated. For example, if the difference $Z(u_0) - G(t_0)$ is less than a predetermined threshold value, then the iterative loop 506, 508, 510, 512 can be terminated. In some instances, the difference $Z(u_0) - G(t_0)$ does not meet the convergence criterion, and the iterative loop 506, 508, 510, 512 continues.

At 510, an improved approximation of the end point velocity $u_0$ can be calculated based on a difference between the pressure drop computed at 508 and the pressure drop boundary condition obtained at 502. The improved approximation can be computed according to an algorithm configured to produce a solution that matches or converges with the pressure drop boundary condition obtained at 502. For example, Newton's method can be used to minimize the function $f(u_0) = Z(u_0) - G(t_0)$ or another minimization function. At 512, the iterative loop 506, 508, 510, 512 can continue until the convergence criterion is satisfied. The iterative loop can terminate upon satisfying a convergence criterion, upon reaching a specified number of iterations, or upon another condition.

After the inner iterative loop 506, 508, 510, 512 terminates, the process 500 progresses to 514, where the time variable is incremented to $t_0+\Delta t$. The process 500 can then return to 502 and compute the pressure drop boundary condition for the next time point, $G(t_0+\Delta t)=p_N-p_0$, using pressure values $p_N$, $p_0$ for the next time point. If the pressure drop boundary condition has changed, the process 500 can proceed to find a solution for the next time point. If the pressure drop boundary condition has not changed, the process 500 can proceed to a subsequent time point, terminate, or proceed in another manner.

FIGS. 6, 7, 8, and 9 are plots showing data for example simulations according to the process 500 shown in FIG. 5. The plot 600 shown in FIG. 6 includes a vertical axis 602 that represents a range of values for the flow velocity u and pressure gradient $\psi$ variables, and a horizontal axis 604 representing a range of values for the position variable x. The curves 606a and 606b represent data generated by an example numerical simulation, and the curves 608a and 608b represent the analytical solutions. In particular, curve 606a represents the numerical solution for the pressure gradient; curve 608a represents the analytical solution for the pressure gradient; curve 606b represents the numerical solution for the flow velocity; and curve 608b represents the analytical solution for the flow velocity.

In the example shown in FIG. 6, the analytical solutions are manufactured solutions that are used to validate the numerical technique. The analytical solutions $u_{an}$ and $\psi_{an}$ represented by the curves 608a and 608b were selected a priori and the source terms were adjusted accordingly. In the example shown in FIG. 6, the analytical solutions $u_{an}=tx^3$ and $\psi=t\cos \pi x$ were chosen, the numerical solution was obtained at t=1, with time step $\Delta t=0.01$, and the number of grid points was N=100. In this example, the average number of iterations for each time step was seven iterations.

In the example shown in FIG. 6, a comparison between the analytical and numerical solutions shows the accuracy of the numerical solution provided by the example numerical simulation. In particular, the curves 606a and 608a overlap in the plot 600, which represents agreement between the numerical and analytical solutions for the pressure gradient $\psi$. And the curves 606b and 608b overlap in the plot 600, which represents agreement between the numerical and analytical solutions for the flow velocity u.

The values plotted in FIG. 7 show the spatial accuracy of example numerical solutions. The plot 700 shown in FIG. 7 includes a vertical axis 702 that represents a range of values for the $L_\infty$ norm of the flow velocity u and pressure gradient $\psi$ variables, and a horizontal axis 704 representing a range of values for grid spacing h. The square symbols (e.g., 708a) represent $L_\infty$ norm values for the pressure gradient generated by example numerical simulations, and the diamond symbols (e.g., point 708b) represent $L_\infty$ norm values for the flow velocity generated by the example numerical simulations. The numerical solutions were obtained up to t=1 for $\Delta t=0.01$.

In the example shown in FIG. 7, the analytical solutions were selected a priori as described above with respect to FIG. 6. The $L_\infty$ norm values plotted in FIG. 7 provide a measure of the error in the numerical simulations based on a comparison to the manufactured analytical solutions. As shown in the plot 700, the $L_\infty$ norm for the pressure gradient with grid spacing h=0.10 (at point 708a) is less than 0.00100, and the $L_\infty$ norm for the flow velocity with grid spacing h=0.10 (at point 708b) is near 0.00100. The lines 706a, 706b plotted in FIG. 7 represent a polynomial fit of the respective data points shown in the plot 700.

Figure 8:
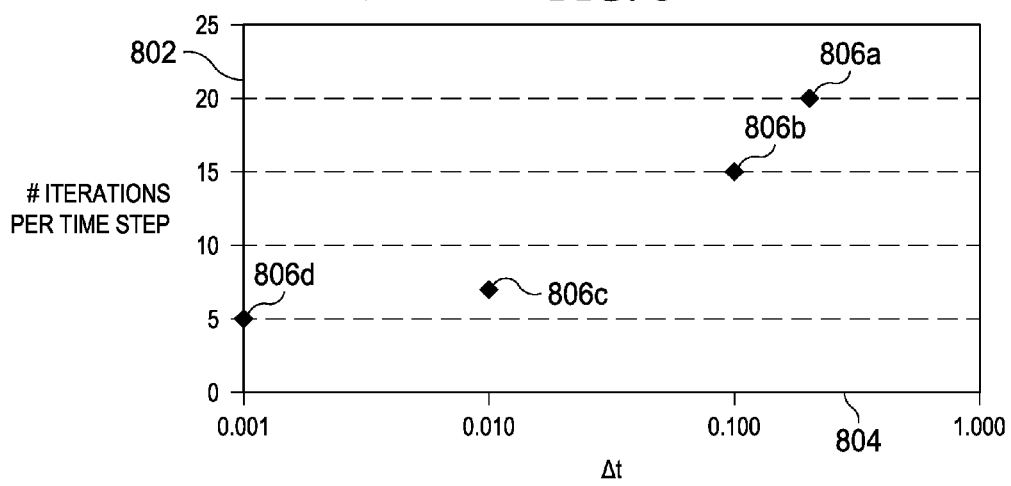
FIG. 8 is a plot showing properties of an example numerical simulation.
Figure 9:
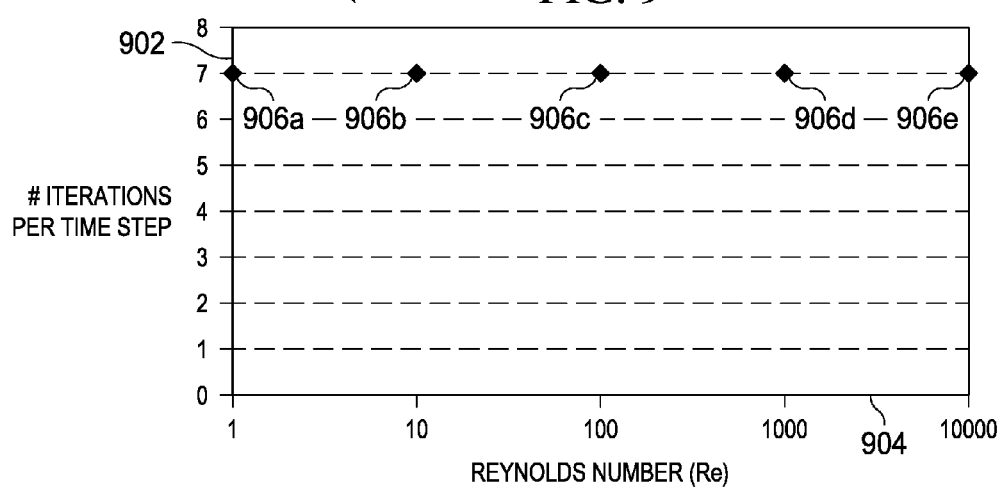
FIG. 9 is a plot showing properties of an example numerical simulation.

In some implementations, the techniques described here can provide a fluid simulation that is robust over a wide range of simulation and fluid parameters. The values plotted in FIGS. 8 and 9 show performance aspects of several example numerical simulations. In particular, FIGS. 8 and 9 show data from simulations where numerical solutions were obtained according to the example process 500 shown in FIG. 5, up to t=1 for N=100.

The plot 800 shown in FIG. 8 includes a vertical axis 802 representing number of iterations per time step, and a horizontal axis 804 representing the size of each time step $\Delta t$. The points 806a, 806b, 806c, and 806d show the average number of iterations in each time step for respective values of the time step parameter. In the example shown in FIG. 8, the time step $\Delta t$ parameter ranges from 0.001 to 1.000, four orders of magnitude on the logarithmic scale of the horizontal axis. As shown in the plot 800, the average number of iterations per time step increases by 15 across the full plotted range of time step ($\Delta t$) values.

The plot 900 shown in FIG. 9 includes a vertical axis 902 representing the number of iterations per time step for a number of example simulations, and a horizontal axis 904 representing the Reynolds number of the simulated fluid. The Reynolds number (Re) is the (unitless) ratio of inertial forces to viscous forces of the simulated fluid. The points 906a, 906b, 906c, and 906d show the average number of iterations in each time step for respective values of the Reynolds number. In the example shown in FIG. 9, the Reynolds number ranges from 1 to 1000, four orders of magnitude on the logarithmic scale of the horizontal axis. As shown in the plot 900, the average number of iterations per time step is stable across the full plotted range of Reynolds number values.

Some embodiments of subject matter and operations described in this specification can be implemented in digital electronic circuitry, or in computer software, firmware, or hardware, including the structures disclosed in this specification and their structural equivalents, or in combinations of one or more of them. Some embodiments of subject matter described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A client and server are generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). The relationship of client and server arises by virtue of computer programs running on the respective computers and having a client-server relationship to each other.

In some aspects, pressure gradient values for respective nodes of a one-dimensional flow model are computed. The nodes represent locations of fluid flow along a flow path, and the pressure gradient values are based on an approximation of the flow velocity at a point the flow path (e.g., an end of the flow path or an intermediate location between the ends of the flow path). A pressure drop between the two opposite ends of the flow path is calculated based on the pressure gradient values. An improved approximation of the flow velocity for the point on the flow path is calculated based on a difference between the computed pressure drop and a pressure drop boundary condition.

Implementations of these and other aspects may include one or more of the following features. The one-dimensional flow model includes a plurality of governing flow equations, and the pressure gradient values are computed according to one or more of the governing flow equations. The governing flow equations define a nonlinear system of equations. The improved approximation is computed based on the governing flow equations and a minimization equation. The minimization equation includes the difference between the computed pressure drop and the pressure drop boundary condition. The pressure drop boundary condition represents a pressure difference between the open and closed ends of a fracture according to pressure data obtained from an injection treatment of the subterranean region.

Additionally or alternatively, these and other implementations may include one or more of the following features. An iterative technique is used to find a flow velocity that leads to a solution that satisfies a convergence criterion for an individual time step. In the iterative technique, an improved approximation of the flow velocity is calculated on each iteration. The improved approximation is calculated on each iteration according to a Newton's-method-based algorithm. The Newton's-method-based algorithm is configured to find a flow velocity that leads to a solution that minimizes the difference between the computed pressure drop and the pressure drop boundary condition. The convergence criterion includes a threshold value for the difference.

Additionally or alternatively, these and other implementations may include one or more of the following features. After finding a flow velocity that leads to a solution that satisfies a convergence criterion for an individual time step, a time variable is incremented to a subsequent time step. An iterative technique is used to find a flow velocity that leads to a solution that satisfies a convergence criterion for the subsequent time step. Flow velocities for each respective node are computed for each time step according to an algorithm that is configured to generate the flow velocities with second-order accuracy in space and time. Flow velocities for each respective node are computed for each time step according to an algorithm that is stable irrespective of the size of the time steps and the quantity of the nodes. Flow velocities for each respective node are computed for each time step according to an algorithm that is stable irrespective of the Reynolds number of the fluid.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

The invention claimed is:

1. A method of determining a well system fluid flow comprising:
   receiving pressure gradient values for respective nodes of a one-dimensional flow model for well system fluid in a fracture in a subterranean region, the nodes representing locations of fluid flow in the fracture, the pressure gradient values being computed based on an approximation of a flow velocity for a first location in the fracture, wherein the fracture is a complex fracture network and the one-dimensional flow model includes a governing flow equation that is a Navier-Stokes equation for both incompressible and compressible fluid flow;
   calculating, by data processing apparatus, a pressure drop between opposite ends of the fracture based on the pressure gradient values;
   calculating an improved approximation of the flow velocity for the first location in the fracture based on a difference between the calculated pressure drop and a pressure drop boundary condition; and
   controlling a well operation for the well system employing a well system fluid flow determined from the pressure drop calculation and the flow velocity calculation.

2. The method of claim 1, wherein the one-dimensional flow model includes a plurality of governing flow equations, and the pressure gradient values are computed according to one or more of the governing flow equations.

3. The method of claim 2, comprising solving for the improved approximation based on the governing flow equations and a minimization equation, wherein the minimization equation includes the difference between the calculated pressure drop and the pressure drop boundary condition.

4. The method of claim 1, wherein the pressure drop boundary condition represents a pressure difference between the opposite ends of the fracture according to pressure data obtained from an injection treatment of the subterranean region.

5. The method of claim 1, wherein the first location in the fracture comprises a first end of the fracture, and the pressure drop is calculated between the first end of the fracture and a second, opposite end of the fracture.

6. The method of claim 5, comprising iteratively finding a flow velocity for the first end of the fracture that satisfies a convergence criterion for an individual time step, wherein an improved approximation of the flow velocity for the first end of the fracture is calculated on each iteration for the individual time step.

7. The method of claim 6, wherein the improved approximation is calculated on each iteration according to an algorithm based on Newton's method, the algorithm being configured to find a flow velocity for the first end of the fracture that minimizes the difference between the calculated pressure drop and the pressure drop boundary condition, and the convergence criterion includes a threshold value for the difference.

8. The method of claim 6, further comprising, after finding the flow velocity for the first end of the fracture that satisfies the convergence criterion for the individual time step:
   incrementing a time variable to a subsequent time step; and
   iteratively finding a flow velocity for the first end of the fracture that satisfies a convergence criterion for the subsequent time step.

9. The method of claim 6, comprising computing flow velocities for each respective node over a sequence of time steps according to an algorithm that is configured to generate the flow velocities with second-order accuracy in space and time.

10. The method of claim 6, comprising computing flow velocities for each respective node over a sequence of time steps according to an algorithm that is stable irrespective of the size of the time steps and the quantity of the nodes.

11. The method of claim 6, comprising computing flow velocities for each respective node over a sequence of time steps according to an algorithm that is stable irrespective of the Reynolds number of the well system fluid.

12. The method of claim 1, wherein the well system fluid includes one or more of:
   a fluid that is injected into the subterranean region during an injection treatment; or
   a fluid that naturally resides in the subterranean region.

13. A non-transitory computer-readable medium storing instructions that, when executed by data processing apparatus, perform operations comprising:
   calculating a pressure drop between opposite ends of a flow path based on pressure gradient values for respective nodes of a one-dimensional flow model that includes a Navier-Stokes equation for fluid flow as a governing flow equation, the nodes representing a sequence of respective flow locations along a flow path for well system fluid flow through a complex fracture network in a subterranean region, the pressure gradient values based on an approximation of flow velocity for a first location in the flow path, wherein the governing flow equation is for both incompressible and compressible fluid flow;
   calculating an improved approximation of the flow velocity for the first location in the flow path based on a difference between the calculated pressure drop and a pressure drop boundary condition; and
   controlling a well operation for the well system employing a well system fluid flow determined from the pressure drop calculation and the flow velocity calculation.

14. The computer-readable medium of claim 13, wherein the governing flow equation is for compressible fluid flow.

15. The computer-readable medium of claim 13, wherein the flow velocity is a flow rate within the complex fracture network.

16. The computer-readable medium of claim 13, wherein the pressure drop boundary condition indicates a pressure difference between the opposite ends of the flow path, and the pressure drop boundary condition is calculated based on pressure data obtained from an injection treatment.

17. The computer-readable medium of claim 13, wherein the one-dimensional flow model employs Newton's method for flow rate modelling.

18. The computer-readable medium of claim 17, wherein the governing flow equations include a continuity equation for incompressible fluid flow, and the improved approximation is calculated based on the governing flow equations and a minimization equation, wherein the minimization equation includes the difference between the calculated pressure drop and the pressure drop boundary condition.

19. A fluid flow modeling system comprising one or more computers that include:
- a pressure-drop-computation module operable to:
  - receive pressure gradient values for respective nodes of a one-dimensional flow model for well system fluid, the nodes representing a sequence of respective flow locations along a flow path in a complex fracture network, the pressure gradient values based on an approximation of flow velocity for a point on the flow path, wherein the one-dimensional flow model includes a governing flow equation that is a Navier-Stokes equation for both incompressible and compressible fluid flow;
  - calculate a pressure drop between first and second ends of the flow path based on the pressure gradient values;
- a solver module operable to calculate an improved approximation of the flow velocity for the point on the flow path based on a difference between the calculated pressure drop and a pressure drop boundary condition; and
- an analytical module to determine a fluid flow utilizing inputs from the pressure-drop-computation module and the solver module, and use the fluid flow to direct operation of a well or reservoir.

20. The fluid flow modeling system of claim 19, wherein the point on the flow path is the first end of the flow path, the one-dimensional flow model includes N nodes, and the pressure-drop-computation module is operable to calculate the pressure drop Z according to:

$$Z = h \sum_{i=1}^{N-1} \psi_i$$

where $\psi_i$ represents the pressure gradient value for the nodes $i = \{1, 2, \ldots N-1\}$ between the first and second ends of the flow path.

21. The fluid flow modeling system of claim 20, wherein the one or more computers include a boundary-condition-computation module operable to compute the pressure drop boundary condition G according to:

$$G = p_N - p_0$$

where $p_0$ represents the pressure for a node $i = 0$ at the first end of the flow path, and $p_N$ represents the pressure for a node $i = N$ at the second end of the flow path.

22. The fluid flow modeling system of claim 21, wherein the solver module is configured to solve for the improved approximation based on governing flow equations and a minimization function.

23. The fluid flow modeling system of claim 22, wherein the minimization function includes the difference Z−G, and the governing flow equations include:

$$u_x = R_1(x,t), \text{ and}$$

$$u_t + uu_x - \mu u_{xx} + \psi = R_2(x,t),$$

where u represents a flow velocity variable, $u_t$ represents a time-derivative of the flow velocity variable u, $u_x$ represents a first-order spatial derivative of the flow velocity variable u, $u_{xx}$ represents a second-order spatial derivative of the flow velocity variable u, $\psi$ represents a pressure gradient variable, $\mu$ represents a viscosity of the well system fluid, $R_1(x,t)$ represents a source term, and $R_2(x,t)$ represents another source term.

24. The fluid flow modeling system of claim 19, further comprising a data acquisition system operable to acquire pressure data from a well system, wherein the one or more computers include a boundary-condition-computation module operable to compute the pressure drop boundary condition from the pressure data.

* * * * *

UNITED STATES PATENT AND TRADEMARK OFFICE
CERTIFICATE OF CORRECTION

PATENT NO. : 10,001,000 B2
APPLICATION NO. : 13/947264
DATED : June 19, 2018
INVENTOR(S) : Kulkarni et al.

Page 1 of 1

It is certified that error appears in the above-identified patent and that said Letters Patent is hereby corrected as shown below:

In the Specification

In Column 14, Line 39, delete formula "$Z(u_0) = h\Sigma_{i=2}^{N-1} \psi_i$," and insert --$Z(u_0) = h\sum_{i=2}^{N-1} \psi_i$,--

Signed and Sealed this
Twenty-first Day of August, 2018

Andrei Iancu
*Director of the United States Patent and Trademark Office*